United States Patent [19]

Yan

[11] Patent Number: 5,045,806

[45] Date of Patent: Sep. 3, 1991

[54] OFFSET COMPENSATED AMPLIFIER

[75] Inventor: Raymond C. Yan, Daly City, Calif.

[73] Assignee: Teledyne Industries, Mountain View, Calif.

[21] Appl. No.: 588,489

[22] Filed: Sep. 26, 1990

Related U.S. Application Data

[63] Continuation of Ser. No. 178,530, Apr. 17, 1988, abandoned.

[51] Int. Cl.[5] .............................................. H03F 3/45
[52] U.S. Cl. ...................................... 330/252; 330/9; 330/253
[58] Field of Search .................... 330/9, 252, 253, 258, 330/259, 261, 277

[56] References Cited

U.S. PATENT DOCUMENTS 4,658,157 4/1987 McGowan ........................ 330/253 X
4,754,169 6/1988 Morris ............................. 330/253 X Primary Examiner—Steven Mottola
Attorney, Agent, or Firm—Fliesler, Dubb, Meyer & Lovejoy

[57] ABSTRACT

A differential input amplifier having adjustable quiescent output voltage is provided by connecting a current means which, responsive to an adjustment voltage, can introduce current into and remove current out of one of the current paths of the amplifier.

25 Claims, 4 Drawing Sheets

5,045,806

OFFSET COMPENSATED AMPLIFIER

This application is a continuation of Ser. No. 07/178,530, filed Apr. 7, 1988, now abandoned.

TECHNICAL FIELD

This present invention relates generally to differential input amplifiers. More specifically, this invention relates to differential input amplifiers having adjustable quiescent output voltage.

BACKGROUND OF THE INVENTION

Differential input amplifiers, for example, operational amplifiers, are basic building blocks of many electrical circuits. A differential input amplifier basically has two otherwise balanced current paths coupled to a constant current source. The amplifier output voltage is generated by application of input signals that alter the respective current through the current paths.

In many applications, it is desirable to have a differential input amplifier operating with a predefined quiescent output voltage (i.e., a predefined output voltage when there is no potential difference between its inverting and non-inverting inputs). However, because of the presence of component mismatches in the constitution of the two current paths, the quiescent output voltage of most differential amplifiers usually departs from the predefined value.

This departure presents many problems to circuit designers. For example, when an operational amplifier is used in an integrator circuit, the quiescent output voltage departure would result in a time-dependent component in the integrator output. In other applications, a quiescent output voltage departure also places a lower limit on the magnitude of the DC (direct current) voltage which can be accurately amplified by the amplifier.

U.S. Pat. No. 4,068,182 is a prior art attempt to provide a differential input amplifier with adjustable quiescent output voltage. Unfortunately, adjustment provided by that invention is good for a particular configuration (i.e. p-channel differential inputs). For n-channel differential inputs, adjustment of the amplifier must reference to the most positive potential of the circuit, which is usually $V_{DD}$. This limitation is bad since in very large scale integrated (VLSI) circuits, there usually exists a large amount of digital logic switching that may cause wide fluctuations in the $V_{DD}$ line. As a result, accurate adjustment in this configuration is usually not possible. Moreover, for p-channel differential inputs, quiescent output voltage adjustment requires an unbalanced current mirror amplifier (CMA), which in turn would introduce non-symmetrical slew rate.

Therefore, there is a need for a differential input amplifier circuit with provision for adjustment of its quiescent output voltage.

SUMMARY OF THE INVENTION

In one aspect, this invention is a circuit for providing adjustment of the quiescent output voltage in a differential input amplifier which has a first current path controlled by a first input signal and a second current path controlled by a second input signal. The circuit comprises: means for receiving an adjustment signal and means coupled to said first current path for introducing current into and removing current out of said first current path in response to said adjustment signal.

In another aspect, this invention is an amplifier having an adjustable quiescent output voltage, comprising: a differential input amplifier having a first current path controlled by a first signal and a second current path controlled by a second signal; means coupled to said first current path for receiving an adjustment signal and for removing current out of and introducing current into said first current path in response the said adjustment signal.

DETAIL DESCRIPTION

Figure 1:
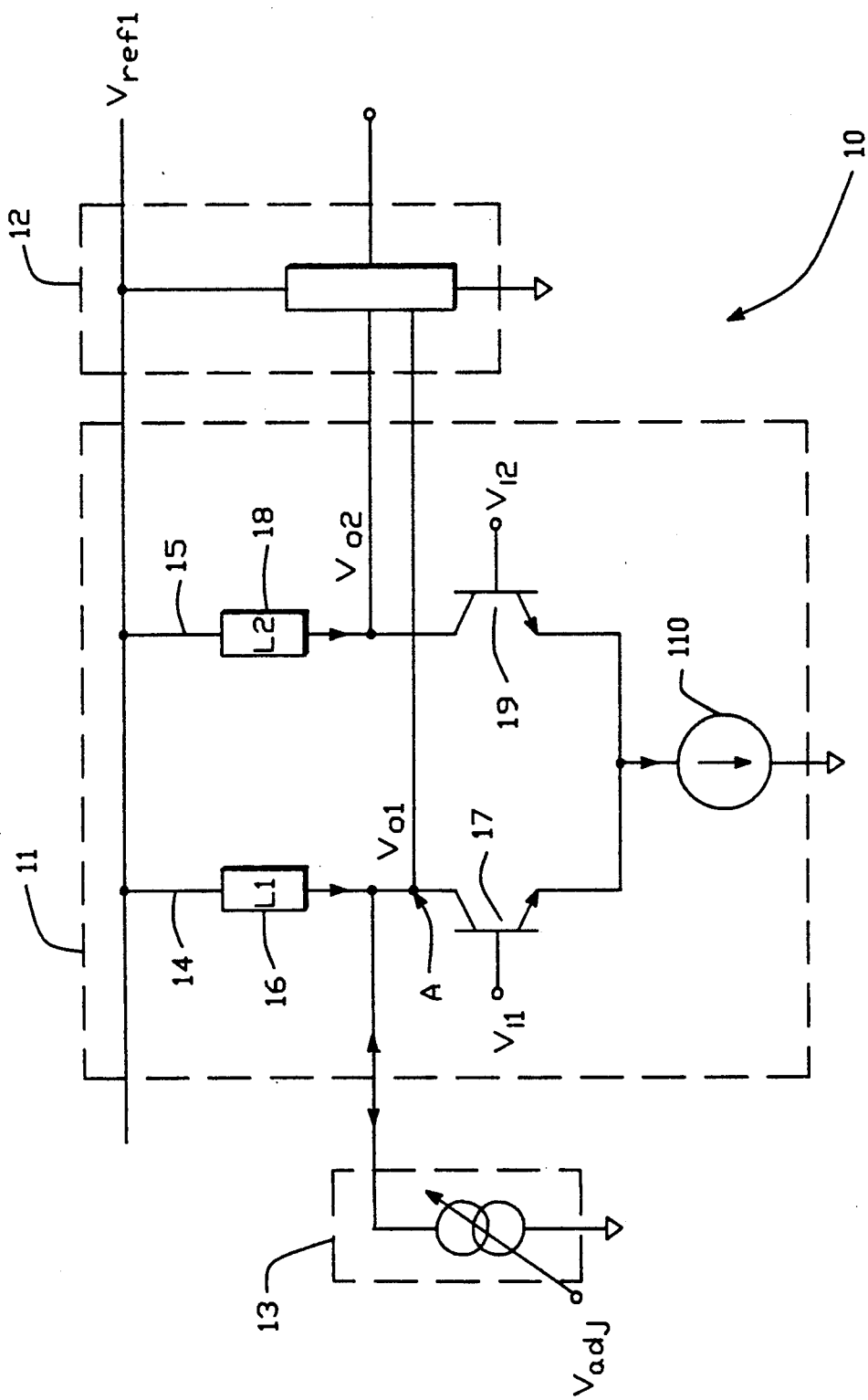
FIG. 1 is a schematic diagram illustrating a general implementation of the differential amplifier circuit according to the present invention.

FIG. 1 is a schematic diagram illustrating an amplifier circuit 10 wherein the present invention is embodied. The circuit 10 comprises basically a differential input amplifier 11, an output stage 12, and a quiescent output voltage adjustment circuit 13.

Differential input amplifier 11 includes a first current path 14 comprising a load 16 connected to the collector of a first transistor 17, and a second current path 15 comprising a load 18 connected to the collector of a second transistor 19. The emitter of transistor 17 and emitter of transistor 19 are commonly coupled to a constant current source 110. Current flowing through current path 14 causes a voltage drop across load 16, thus producing an output voltage $V_{O1}$ with respect to $V_{REF1}$. This voltage $V_{O1}$ depends on the current flowing through load 16, which is in turn controlled by an input signal $V_{i1}$ applied to the base of transistor 17. Similarly, current flowing through current path 15 causes a voltage drop across load 18, thus producing another output voltage $V_{O2}$ with respect to $V_{REF1}$. The current through the current path 15 is controlled by a second input signal $V_{i2}$ applied to the base of transistor 19. Output voltages $V_{O1}$ and $V_{O2}$ are connected to output stage 12 whereby an output voltage of the amplifier circuit 10 is given as a function of the difference between $V_{O1}$ and $V_{O2}$.

The quiescent output voltage is defined as the output voltage of the amplifier 10 when the difference between input voltage $V_{O1}$ and input voltage $V_{O2}$ is at a predefined potential level. Ideally, the components of differential amplifier 11 are chosen so that the output quiescent voltage is at a predefined value (typically, current path 14 is designed to be symmetrical to current path 15). However, because of component mismatches between current paths 14 and 15, the quiescent output voltage of amplifier 11 usually departs from the predefined value.

According to the present invention, an adjustable current source 13 is connected to the node A between load 16 and transistor 17. This current source 13 has the capability of introducing current into and removing current out of the current path at the node A. If the components of the amplifier 10 match perfectly, current source 13 will have zero current value. However, if the current paths are unbalanced in that, at quiescence, current path 15 conducts more current than current path 14, then current source 13 operates to drain current from current path 14, thus causing the voltage drop across load 16 to be equal to the voltage drop across load 18. On the other hand, if the current paths are unbalanced in that, at quiescence, current path 14 conducts more current then current path 15, adjustable current source 13 operates to introduce current into current path 14. Since the amount of current drain by current source 110 is constant, the introduction of current into current path 14 would in effect reduce the current through load 16. Therefore, by adjusting the current source 13, the quiescent output voltage of the amplified circuit can be adjusted.

Figure 2:
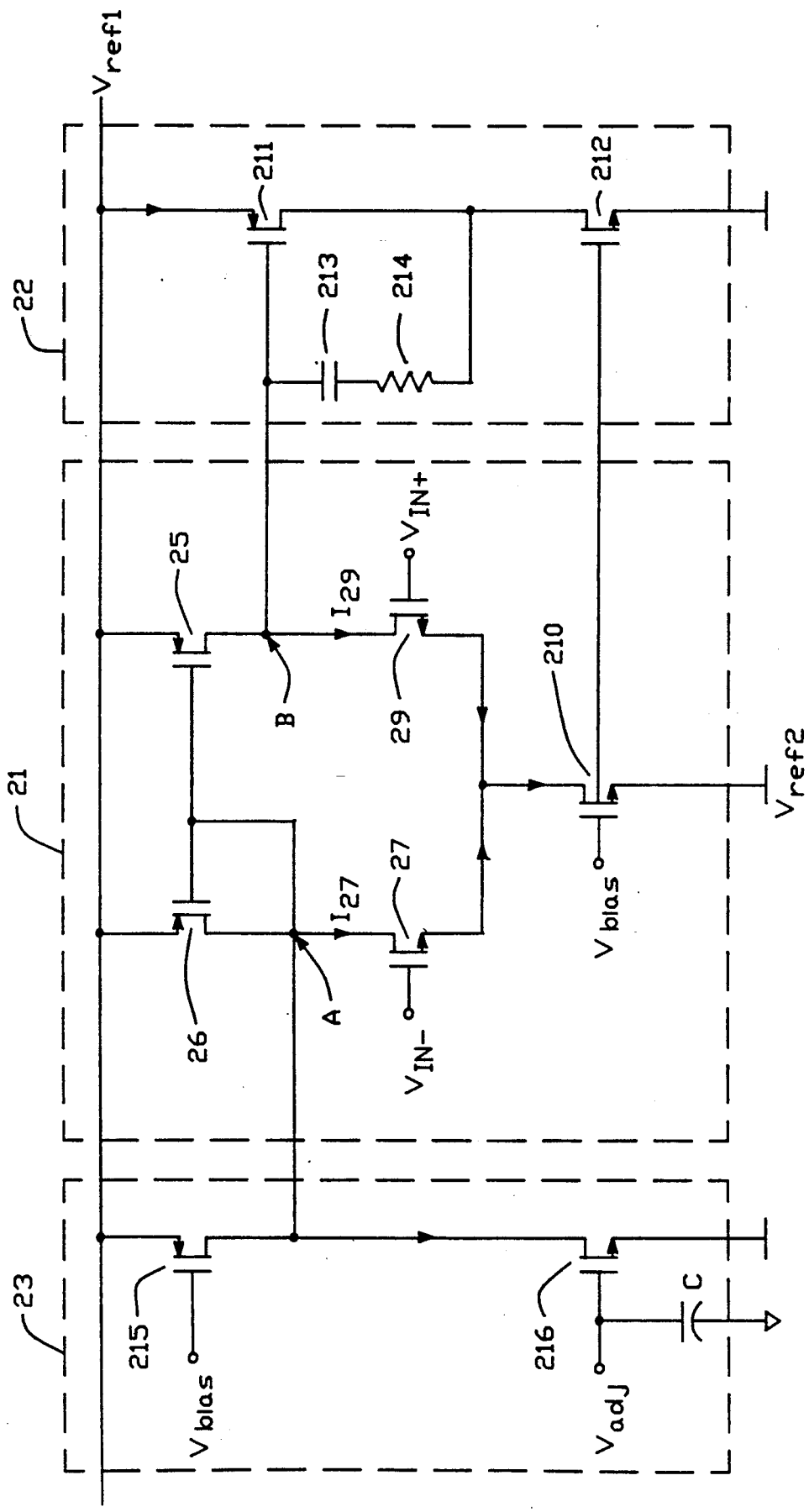
FIG. 2 is a schematic diagram illustrating a complementary metallic oxide semiconductor (CMOS) implementation of the amplifier circuit according to the present invention.

Referring to FIG. 2, there is shown a complementary metal oxide semiconductor (CMOS) implementation of the amplifier circuit embodying the present invention. The circuit has a differential input amplifier 21 coupled to an output stage 22, as well as a quiescent voltage adjustment circuit 23. Differential amplifier 21 comprises differential input devices 27 and 29, both of which are, according to this particular implementation, n-channel MOS transistors. The respective drain terminals of transistor 27 and 29 are commonly coupled to a constant current source formed, according to this particular implementation, by n-channel MOS transistor 210 biased into saturation mode. P-channel transistors 26 and 25 form a current mirror and combine to operate as a load of the differential input amplifier 21. The drain terminal of transistor 26 is connected to the source terminal of transistor 27 to form a first current path. The drain terminal of transistor 25 is connected to the source terminal of transistor 29 to form a second current path. The output voltage of the differential amplifier 21 is obtained at a node B which is the connecting point of transistor 25 and transistor 29. The output stage 22 comprises a common source transistor 211 connected to a current source 212 which is an n-channel MOS transistor biased to saturation mode. Transistor 211 and transistor 212 combine to make a class A output stage. Capacitor 213 and resistor 214 are used for compensation. The output voltage of the differential amplifier 21 is equal to the voltage between the drain and the source of transistor 25.

Ideally, at quiescence, the current through the current path of transistors 26, 27 is equal to the current through the current path of transistors 25, 29. However, such ideal condition is usually not practically attainable because of the difficulty involved in producing components with identical parameters.

Node A, the connecting point of transistors 26 and 27, is connected to a circuit 23 for adjusting the quiescent output voltage. Circuit 23, in general, has the capability of removing current out of, as well as introducing current into node A of the differential input amplifier 21 in response to an external adjustment signal. According to the preferred implementation of this invention, circuit 23 comprises a constant current source for introducing current into node A, and means responsive to the external adjustment signal for draining current from node A. Also, in accordance with the present implementation, circuit 23 comprises a p-channel MOS transistor 215 and n-channel MOS transistor 216. The source of transistor 215 is connected to reference voltage $V_{REF1}$. The drain terminal of transistor 215 is connected to the source terminal of transistor 216. The drain terminal of transistor 216 is connected to a second reference voltage $V_{REF2}$. Transistor 215 forms the constant current source by connecting its gate terminal to a voltage so biased that transistor 215 it operates in saturation and drains a constant current. The gate terminal of transistor 216 is connected to the external adjustment signal.

Assume, for illustration purposes, that the current through node A of the first current path and the current through node B of the second current path are balanced so that there is no voltage offset. Further, assume that the bias voltage $V_{bias}$ to transistor 210 is set so that a combined current of 40 ua is constantly drained from both the first current path and the second current path. Since the current paths are nominally balanced, the current $I_{27}$ through the transistor 27 should be equal to the current $I_{29}$ flowing through the transistor 29, that is 20 ua, as $I_{26}$ is equal to $I_{25}$ because of inherent current mirror action.

Assuming that the constant current source of transistor 215 is biased to produce a constant current of 10 ua, then the adjustment voltage will be set so that transistor 216 conducts the current of 10 ua supplied by transistor 215, and no current will flow in or out of circuit 23.

Suppose there exists a voltage offset of 20 mv at the gate of transistor 29 which results in $I_{29}$ being equal to 22 ua. Since the total current flowing through both current paths of transistors 27 and 29 must equal to the current of 40 ua drained by the constant current source transistor 210, the current $I_{27}$ must be equal to 18 ua.

To balance the current flowing through transistors 25 and 26, an extra amount of current of 4 ua must be caused to flow through transistor 26. This extra amount of current can be drained through transistor 26 by setting the adjustment signal at its gate so that more current is drained by it.

Figure 3:
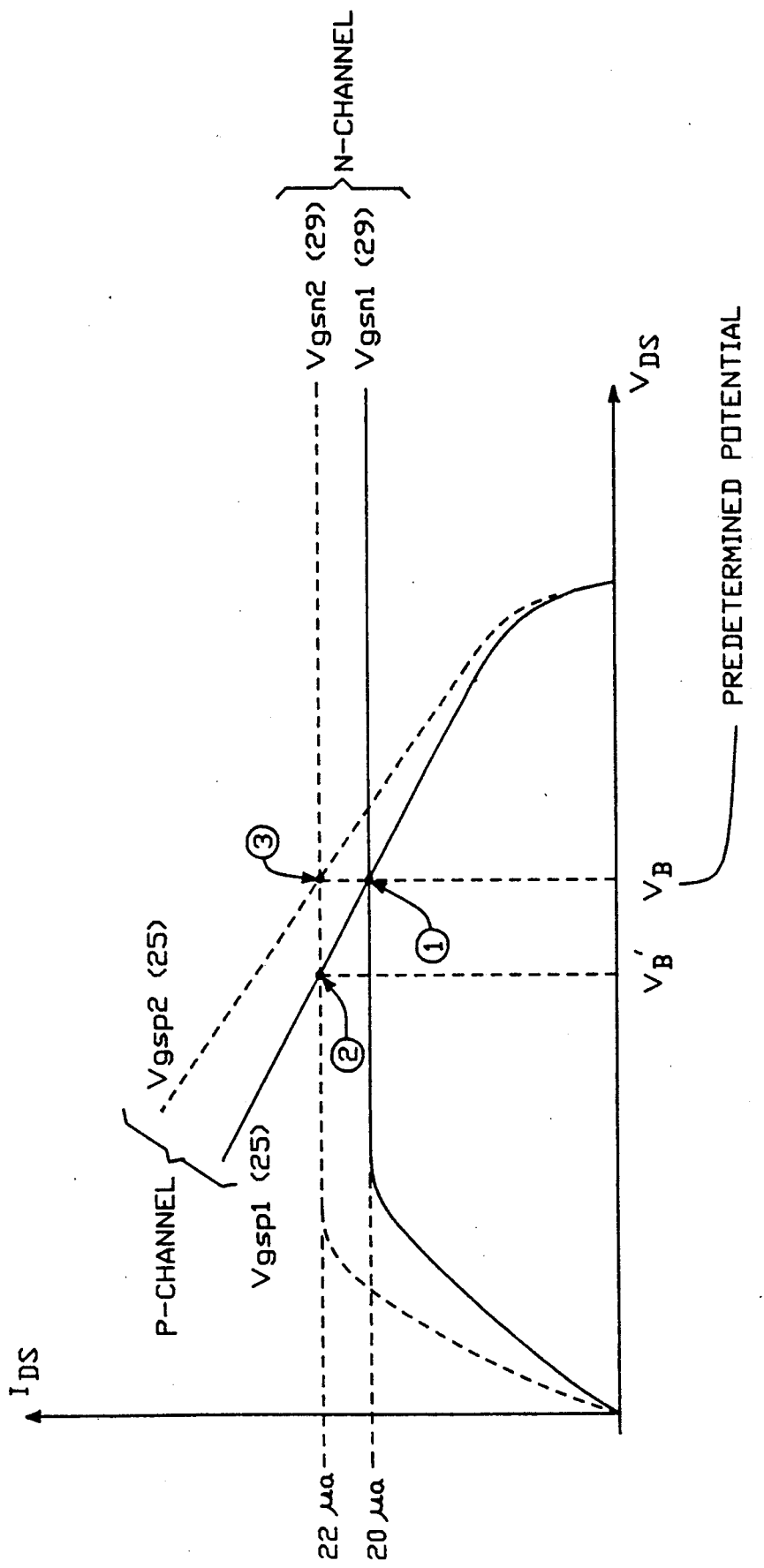
FIG. 3 is a current-voltage curve illustrating the operation of the circuit shown in FIG. 2.
Figure 4:
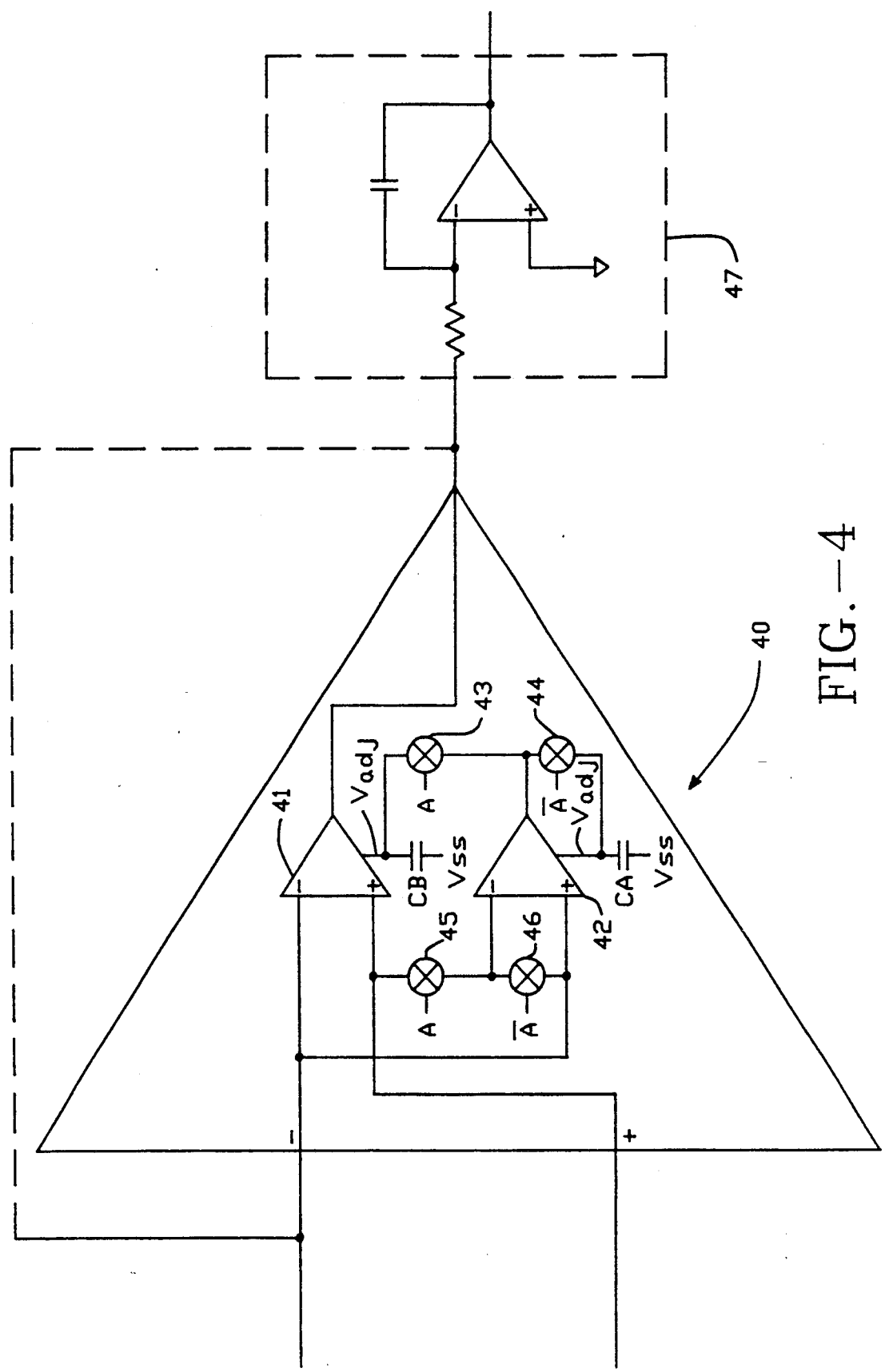
FIG. 4 is a schematic diagram of an integrator circuit wherein the present invention is embodied.

The current versus voltage (I-V) graph of FIG. 4 illustrates the operation of the circuit according this embodiment of the present invention. Since the current flowing through transistors 25 is equal to the current flowing through transistor 29, the point where the n-channel and the p-channel I-V curves intersect is the desired operating potential $V_B$ of the amplifier (shown as point 1 in the graph of FIG. 3). When component mismatches cause an offset voltage equals a voltage $V_{os}$ at the input of transistor 29, 22 ua will flow through transistors 25 and 29. If no adjustment is made, a voltage $V_B'$, will result at the output of node B (shown as point 2 in the graph of FIG. 3). To restore node B to the predetermined voltage level of $V_B$, the voltage at node A must decrease with respect to $V_{ref2}$ by increasing the current flowing in the p-channel device transistor 26 (shown as point 3 in the graph of FIG. 3).

In order to lower the voltage at node A, the adjustment signal, $V_{adj}$, at the gate of transistor 216 must be increased. The adjustment will continue until a current of 14 ua (10 ua from the current source and 4 ua out of node A) flows through adjustment transistor 216.

The relationship between the inputs of the differential transistor pair 27 and 29 and the adjustment transistor 216 is:

$$(\Delta V_{adj}/\Delta V_{in}) = -(Gm_{216}/Gm_{29})(Gm_{25}/Gm_{26})$$

where Gm is the transconductance of a transistor.

As an example: let $Gm_{29} = 100$ uv, $Gm_{216} = 10$ uv, $Gm_{25} = 50$ uv, $Gm_{26} = 50$ uv, then for a offset voltage $V_{os}$ of $-20$ mv at the input of the differential transistor pair 27 and 29, the adjustment voltage $V_{adj}$ required to bring the voltage at node B back to the predetermined level is:

$$\Delta V_{adj} = -(-20 \text{ mv})(100 \text{ ua}/10 \text{ ua})(50 \text{ uv}/50 \text{ uv})$$
$$= 200 \text{ mv}.$$

This means that the voltage $V_{adj}$ at the gate of transistor 216 must increase by 200 mv from its quiescent value to bring the voltage at node B back to the desired level.

In summary, with a different offset voltage, the adjustment voltage can be set to produce a preferred quiescent output voltage.

FIG. 4 illustrates an integrate circuit wherein the present invention is embodied as a signal buffer 40. The buffer 40 of FIG. 4 comprises a first amplifier 41 and a second amplifier 42 each implemented according to the present invention with means for adjusting its quiescent output voltage. The output of amplifier 42 is connected to the adjustment input of amplifier 41 via a switch 43. The output of amplifier 42 is also connected to its own adjustment input via a switch 44. The inverting and non-inverting inputs of amplifier 42 are connected to a switch 46. The inverting input of amplifier 42 is also connected to the non-inverting input of amplifier 41 via a switch 45.

Switches 43 and 45 both open and close together under the control of a digital signal A. Switches 44 and 46 both open and close together under the control of a digital signal $\overline{A}$ which has an opposite phase to signal A. Signal A is generated by a one pulse circuit (not shown) which can either be incorporated with the buffer 40 or externally.

In the first phase of the operation of buffer 40, a logical high signal is applied to switches 44 and 46 and a logical low signal is applied to switches 43 and 45. As a result, the differential inputs of amplifier 42 are shorted and a quiescent output voltage of amplifier 42 will appear at the adjustment input through switch 44, causing amplifier 44 to offset-compensate itself to having zero input offset voltage.

In the second phase, a logical low signal is applied to switches 44 and 46, and a logical high signal is applied to switches 43 and 45. Any voltage difference $V_{in}$ between the differential inputs of amplifier 41 will appear as differential input signal, $V_{in}$, to amplifier 42. The output, $(-A_{42} \times V_{in}$, where $A_{42}$ is the gain of amplifier 42), of amplifier 42 is applied to the adjustment input of amplifier 41 through switch 43 and drives the amplifier 41 until its offset becomes zero.

During the two phases, capacitors CA and CB hold the respective voltages needed to keep the respective offset voltages to zero at the respective adjustment input terminals.

While the subject invention has been described with reference to particular implementations and types of semiconductor devices, it should be understood that other implementations and semiconductor devices, as well as various changes and modifications, could be made therein, by one skilled in the art, without varying from the scope and spirit of the subject invention as defined by the claims.

I claim:

1. A circuit for providing adjustment of quiescent output voltage of a differential input amplifier, the differential input amplifier having a first current path controlled by a first input signal and a second current path controlled by a second input signal, the circuit comprising:
   (a) adjustment receiving means for receiving a variable adjustment signal; and
   (b) current means, coupled to said first current path and said adjustment receiving means, for selectively removing current from said first current path or introducing current into said first current path or neither introducing current into nor removing current from said first current path in response to said variable adjustment signal.

2. A circuit as in claim 1, wherein said current means comprises:
   (a) first means connected to said first current path for supplying a constant current; and
   (b) second means coupled to said first means and said first current path for receiving the variable adjustment signal, and for draining current from one or both of said first current path and said first means in response to said adjustment signal.

3. A circuit as in claim 2, wherein said first means includes a transistor biased into saturation.

4. A circuit as in claim 2, wherein said second means is a field effect transistor connected to said first current path, said field effect transistor having a control electrode receiving said adjustment signal.

5. A circuit comprising:
   (1) a differential input amplifier having a quiescent output voltage which is to be adjusted to a desired level, the differential input amplifier receiving first and second differential input signals, and having:
   (1a) a first current path, responsive to the first differential input signal, comprising a first transistor of a first conductivity type connected between a first reference voltage and a first node, and a second transistor of a second conductivity type connected between the first node and a constant current source, the second transistor being controlled by a corresponding gate electrode receiving the first differential input signal, and
   (1b) a second current path, responsive to the second differential input signal, comprising a third transistor of the first conductivity type connected between the first reference voltage and a second node, and a fourth transistor of the second conductivity type connected between the second node and the current source, the fourth transistor being controlled by a corresponding gate electrode receiving the second differential input signal, and the circuit further comprising:
   (2) adjustable offset means for adjusting the quiescent output voltage to the desired level, said adjustable offset means having:
   (2a) current source means, connected to said first node, for supplying current; and
   (2b) current draining means, connected to said first node and to said current source means, for receiving a variable adjustment signal and for adjustably draining current from one or both of said first node and to said current source means in response to said adjustment signal.

6. A circuit as in claim 5 wherein said current source means comprises a fifth transistor of said first conductivity type connected between said reference voltage and said first node, and said current draining means comprises a sixth transistor of said second conductivity type connected to said first node, said sixth transistor being controlled by a corresponding gate electrode receiving a variable adjustment voltage as said adjustment signal.

7. An amplifier comprising:
(a) differential input amplifier having a quiescent output voltage, comprising a first current path controlled by a first input signal received at a first terminal and a second current path controlled by a second input signal received at a second terminal;
(b) means receiving a variable adjustment signal for adjusting said quiescent output voltage; and
(c) current means coupled to said first current path and said receiving means for selectively removing current from or introducing current into said first current path in response to said adjustment signal.

8. An amplifier as in claim 7, wherein said current means comprises:
(a) first means connected to said first current path for supplying a constant current; and
(b) second means connected to said first means and said first current path and responsive to said adjustment signal for removing current from one or both of said first current path and said first means.

9. An amplifier as in claim 8, wherein said first means includes a transistor biased into saturation.

10. An amplifier as in claim 8, wherein said second means includes a transistor channel connected to said first current path, said transistor channel having a control electrode receiving a variable adjusting voltage for controlling current flow through said channel.

11. An amplifier having an adjustable quiescent output voltage, comprising:
(a) a differential input amplifier having a first current path comprising a first transistor channel of a first conductivity type connected between a first reference voltage and a fist node, and a second transistor channel of a second conductivity type connected between the first node and a first current source, the second transistor channel being controlled by a corresponding gate electrode receiving a first input signal, the differential input amplifier further having a second current path comprising a third transistor channel of said first conductivity type connected between the first reference voltage and a second node, and a fourth transistor channel of the second conductivity type connected between the second node and the first current source, the fourth transistor channel being controlled by a corresponding gate electrode receiving a second input signal; and
(b) circuit for controlling quiescent voltage offset of said differential input amplifier, comprising:
(i) a second current source connected to said first node for supplying current to said first node; and
(ii) means receiving a variable adjustment signal for removing current from said first node in response to said adjustment signal.

12. An amplifier as in claim 11 wherein said second current source comprises a fifth transistor channel of said first conductivity type connected between said reference voltage and said first node, and said current removing means comprises a sixth transistor channel of said second conductivity type connected to said first node, said sixth transistor channel being controlled by a corresponding gate electrode receiving said adjustment signal.

13. An amplifier as in claim 12, wherein each channel of said first conductivity type is an n-channel in a metal oxide semiconductor transistor and each channel of said second conductivity type is a p-channel in a metal oxide semiconductor transistor.

14. An amplifier as in claim 12, wherein each channel of said first conductivity type is a p-channel in a metal oxide semiconductor transistor and each channel of said second conductivity type is an n-channel in a metal oxide semiconductor transistor.

15. An amplifier as in claim 12, wherein both said first and second conductivity types are defined in bipolar semiconductor transistors.

16. An electrical device, comprising
(a) an amplifier having an adjustable quiescent output voltage, comprising:
(i) a differential input amplifier having a first current path comprising a first transistor channel of a first conductivity type connected between a first reference voltage and a first node, and a second transistor channel of a second conductivity type connected between the first node and a first current source, the second transistor channel being controlled by a corresponding gate electrode receiving a first input signal, the differential input amplifier further having a second current path comprising a third transistor channel of said first conductivity type connected between the first reference voltage and a second node, and a fourth transistor channel of the second conductivity type connected between the second node and the first current source, the fourth transistor channel being controlled by a corresponding gate electrode receiving a second input signal; and
(ii) circuit for controlling quiescent voltage offset of said differential input amplifier, comprising:
(iia) a second current source connected to said first node for supplying current to said first node; and
(iib) means receiving a variable adjustment signal for removing current from said first node in response to said adjustment signal; and
(b) a signal processing device coupled to said amplifier for processing its output signal.

17. The apparatus as in claim 16, wherein said signal processing device is a signal integrator.

18. The apparatus as in claim 17, wherein said second current source of said amplifier comprises a fifth transistor channel of said first conductivity type connected between said reference voltage and said first node, and said current removing means comprises a sixth transistor channel of said second conductivity type connected to said first node, said sixth transistor channel being controlled by a corresponding gate electrode receiving said adjustment signal.

19. The apparatus as in claim 17, wherein said first conductivity type is n-channel metal oxide semiconductor and said second conductivity type is p-channel metal oxide semiconductor.

20. The apparatus as in claim 17, wherein said first conductivity type is p-channel metal oxide semiconductor and said second conductivity type is n-channel metal oxide semiconductor.

21. The apparatus as in claim 19, wherein both said first and second conductivity types are bipolar semiconductor.

22. The circuit of claim 1 wherein said adjustment signal is an adjustment voltage and a first variation to the adjustment voltage produces a smaller second variation to said quiescent output voltage.

23. The circuit of claim 5 wherein said adjustment signal is an adjustment voltage and a first variation to the adjustment voltage produces a smaller second variation to said quiescent output voltage.

24. The circuit of claim 7 wherein said adjustment signal is an adjustment voltage and a first variation to the adjustment voltage produces a smaller second variation to said quiescent output voltage.

25. The circuit of claim 16 wherein said adjustment signal is an adjustment voltage and a first variation to the adjustment voltage produces a smaller second variation to said quiescent output voltage.

* * * * *